US012669573B2

(12) United States Patent
Al-Eryani

(10) Patent No.: US 12,669,573 B2
(45) Date of Patent: Jun. 30, 2026

(54) DEVICE FOR GENERATING IQ SIGNALS AND METHOD FOR MANUFACTURING A DEVICE FOR GENERATING IQ SIGNAL

(71) Applicant: Robert Bosch GmbH, Stuttgart (DE)

(72) Inventor: Jidan Al-Eryani, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 384 days.

(21) Appl. No.: 18/392,539

(22) Filed: Dec. 21, 2023

(65) Prior Publication Data

US 2024/0219513 A1 Jul. 4, 2024

(30) Foreign Application Priority Data

Jan. 3, 2023 (DE) ..................... 10 2023 200 035.0

(51) Int. Cl.
*G01S 7/03* (2006.01)
*H03H 7/00* (2006.01)
*H03H 7/01* (2006.01)
*H03H 7/09* (2006.01)
*H03H 7/18* (2006.01)

(52) U.S. Cl.
CPC ................. *G01S 7/03* (2013.01); *H03H 7/00* (2013.01); *H03H 7/0123* (2013.01); *H03H 7/09* (2013.01); *H03H 7/18* (2013.01)

(58) Field of Classification Search
CPC ........ H03H 7/0123; H03H 7/425; H03H 7/18; H03H 7/00; G01S 7/03

USPC ...................................... 333/4, 5, 25, 26, 175
See application file for complete search history.

(56) References Cited

U.S. PATENT DOCUMENTS

| | | | |
|---|---|---|---|
| 10,734,966 B2 | 8/2020 | Joshi et al. | |
| 2022/0158682 A1* | 5/2022 | Huang | .................... H03F 3/245 |

FOREIGN PATENT DOCUMENTS

| | | |
|---|---|---|
| DE | 4420447 A1 | 3/1995 |
| DE | 20122673 U1 | 3/2007 |

* cited by examiner

*Primary Examiner* — Rakesh B Patel
(74) *Attorney, Agent, or Firm* — NORTON ROSE FULBRIGHT US LLP

(57) ABSTRACT

A device for generating IQ signals. An input port receives a differential input signal via a first and a second terminal of the input port. A first output port outputs a differential I output signal. A first terminal is electrically connected to the first terminal of the first output port via a first connecting line and a second terminal is electrically connected to the second terminal of the first output port via a second connecting line. A second output port outputs a differential Q output signal via a first and a second terminal of the second output port. The first terminal of the second output port is electrically connected to a first terminal of an isolated port via a third connecting line, and the second terminal of the second output port is electrically connected to a second terminal of the isolated port via a fourth connecting line.

10 Claims, 10 Drawing Sheets

DEVICE FOR GENERATING IQ SIGNALS AND METHOD FOR MANUFACTURING A DEVICE FOR GENERATING IQ SIGNAL

FIELD

The present invention relates to a device for generating IQ signals and to a method for manufacturing a device for generating IQ signals.

BACKGROUND INFORMATION

In wireless communication and in radar systems, the in-phase & quadrature method (IQ method) is often used to ascertain phase information. In doing so, the generation of quadrature signals (IQ signals) with low phase and amplitude errors between the I and Q channels is essential. In receiving devices, for example, a high IQ phase or amplitude error impairs the ability to suppress interference patterns.

In the upper GHz frequency range, it is advantageous to generate the IQ signals directly on the chip, since the power losses of the connecting lines and the interference variables increase with increasing frequency. Passive IQ generators may therefore be more suitable for generating high-precision IQ signals than active IQ generators. This applies in particular to applications in the millimeter wave range, such as in the 76 GHz to 81 GHZ frequency range used for vehicle radar sensors.

Moreover, due to the high space costs, it is important that the IQ generator blocks are compact in terms of space in order to save costs.

Finally, one of the critical factors for IQ generation is the dependence of the amplitude errors and phase errors on the connected load impedance. In real applications, for example, the load can be an amplifier or a buffer with changing impedance as a function of the signal amplitude. In high-frequency applications, the impedance can change considerably with the frequency. Matching networks are used here to match the various blocks for optimum power transmission, typically to 50 ohms.

A phase shifter for integrated circuits in the gigahertz range is described in U.S. Pat. No. 10,734,966 B2.

SUMMARY

The present invention provides a device for generating IQ signals and a method for manufacturing a device for generating IQ signals.

Preferred example embodiments of the present invention are disclosed herein.

According to a first aspect, the present invention thus relates to a device for generating IQ signals. According to an example embodiment of the present invention, the device has an input port, a first output port, a second output port and an isolated port. The input port is designed to receive a differential input signal via a first and a second terminal of the input port. The first output port is designed to output a differential I output signal via a first and a second terminal of the first output port, wherein the first terminal of the input port is electrically connected to the first terminal of the first output port via a first connecting line, and wherein the second terminal of the input port is electrically connected to the second terminal of the first output port via a second connecting line. The second output port is designed to output a differential Q output signal via a first and a second terminal of the second output port. The isolated port comprises two terminals, wherein the first terminal of the second output port is electrically connected to the first terminal of the isolated port via a third connecting line, and wherein the second terminal of the second output port is electrically connected to the second terminal of the isolated port via a fourth connecting line. The first and second connecting lines are formed in at least a first plane of a substrate of the device. The third and fourth connecting lines are formed offset to the first and second connecting lines in at least a second plane of the substrate. In a top view, the first to fourth connecting lines are arranged symmetrically with respect to a first axis and asymmetrically with respect to a second axis, wherein the first axis and the second axis are orthogonal to one another in a substrate plane of the substrate.

According to a second aspect, the present invention relates to a method for manufacturing a device for generating IQ signals. An input port is formed. The input port can receive a differential input signal via a first and a second terminal of the input port. A first output port is formed. The first output port is designed to output a differential I output signal via a first and a second terminal of the first output port, wherein the first terminal of the input port is electrically connected to the first terminal of the first output port via a first connecting line, and wherein the second terminal of the input port is electrically connected to the second terminal of the first output port via a second connecting line. A second output port is formed, which is designed to output a differential Q output signal via a first and a second terminal of the second output port. An isolated port having two terminals is formed, wherein the first terminal of the second output port is electrically connected to the first terminal of the isolated port via a third connecting line, and wherein the second terminal of the second output port is electrically connected to the second terminal of the isolated port via a fourth connecting line. The first and second connecting lines are formed in at least a first plane of a substrate of the device. The third and fourth connecting lines are formed offset to the first and second connecting lines in at least a second plane of the substrate. In a top view, the first to fourth connecting lines are arranged symmetrically with respect to a first axis and asymmetrically with respect to a second axis, wherein the first axis and the second axis are orthogonal to one another in a substrate plane of the substrate.

SUMMARY

One of the findings underlying the present invention is that, due to its asymmetrical structure, the IQ generator has a low phase and amplitude error within a wide frequency bandwidth as well as a low power loss. In other words, by deliberately designing the device for generating IQ signals asymmetrically with respect to a planar axis, performance can be improved.

According to an example embodiment of the present invention, the first to fourth connecting lines are preferably arranged in such a way that, in a top view, the arrangement of the totality of the first and second connecting lines is the same as the arrangement of the totality of the third and fourth connecting lines. Thus, the exact arrangements (courses of the connecting lines) can be identical and the totality of the first and second connecting lines can be offset to the totality of the third and fourth connecting lines only in one direction orthogonal to the substrate, i.e., can be arranged in different planes. The totality of the first and second connecting lines represents a (differential) primary coil and the totality of the third and fourth connecting lines represents a (differential) secondary coil. Thus, the IQ generator acts as a transformer for generating the IQ signals.

According to one example embodiment of the device of the present invention for generating IQ signals, the device furthermore comprises at most three passive circuit elements comprising an electrical resistor that is connected between the first terminal and the second terminal of the isolated port. Passive circuit elements can preferably be understood exclusively as capacitors, coils and electrical resistors.

According to one example embodiment of the device of the present invention for generating IQ signals, the at most three passive circuit elements comprise a first capacitor that is connected between the first terminal of the first output port and the first terminal of the isolated port.

According to one example embodiment of the device of the present invention for generating IQ signals, the at most three passive circuit elements comprise a second capacitor that is connected between the second terminal of the input port and the second terminal of the second output port. With only three passive circuit elements, specifically an electrical resistor and two capacitors, it is possible to generate the IQ signals (i.e., the I output signal and the Q output signal) and at the same time adjust all terminals to the same differential impedance 2·Z0. The reference impedance Z0 can be 50 ohms, for example, as is usual with HF systems. The device is thus intrinsically adjusted. In particular, no additional component is required for the adjustment.

According to one example embodiment of the device of the present invention for generating IQ signals, different matching impedances and output phase shifts can be achieved by varying the geometry parameters such as diameter, number of loop windings and width of the connecting lines.

According to one example embodiment of the device of the present invention for generating IQ signals, a capacitance of the first capacitor can be set. Alternatively or additionally, a capacitance of the second capacitor can be set. The phase and amplitude error can be set in the field by adjusting a capacitance of one of the capacitors.

According to one example embodiment of the device of the present invention for generating IQ signals, the first capacitor and/or the second capacitor is designed as a controllable varactor or as a capacitor that can be switched on and off digitally. The control and setting can be effected on-chip.

According to one example embodiment of the device of the present invention for generating IQ signals, the first to fourth connecting lines in each case have at least one and a half windings.

According to one example embodiment of the method of the present invention for manufacturing the device for generating IQ signals, at most three passive circuit elements are furthermore formed, comprising an electrical resistor connected between the first terminal and the second terminal of the isolated port.

According to one example embodiment of the method of the present invention for manufacturing the device for generating IQ signals, the at most three passive circuit elements comprise a first capacitor that is connected between the first terminal of the first output port and the first terminal of the isolated port.

According to one example embodiment of the method of the present invention for manufacturing the device for generating IQ signals, the at most three passive circuit elements comprise a second capacitor that is connected between the second terminal of the input port and the second terminal of the second output port.

According to one example embodiment of the method of the present invention for manufacturing a device for generating IQ signals, a capacitance of the first capacitor and/or a capacitance of the second capacitor can be set.

Further advantages, features and details of the present invention will become apparent from the following description, in which various exemplary embodiments are described in detail with reference to the figures.

DETAILED DESCRIPTION OF EXAMPLE EMBODIMENTS

In all figures, identical or functionally identical elements and devices are provided with the same reference signs. The numbering of method steps serves the purpose of clarity and is generally not intended to imply a specific chronological order. In particular, a plurality of method steps can be carried out simultaneously.

Figure 1:
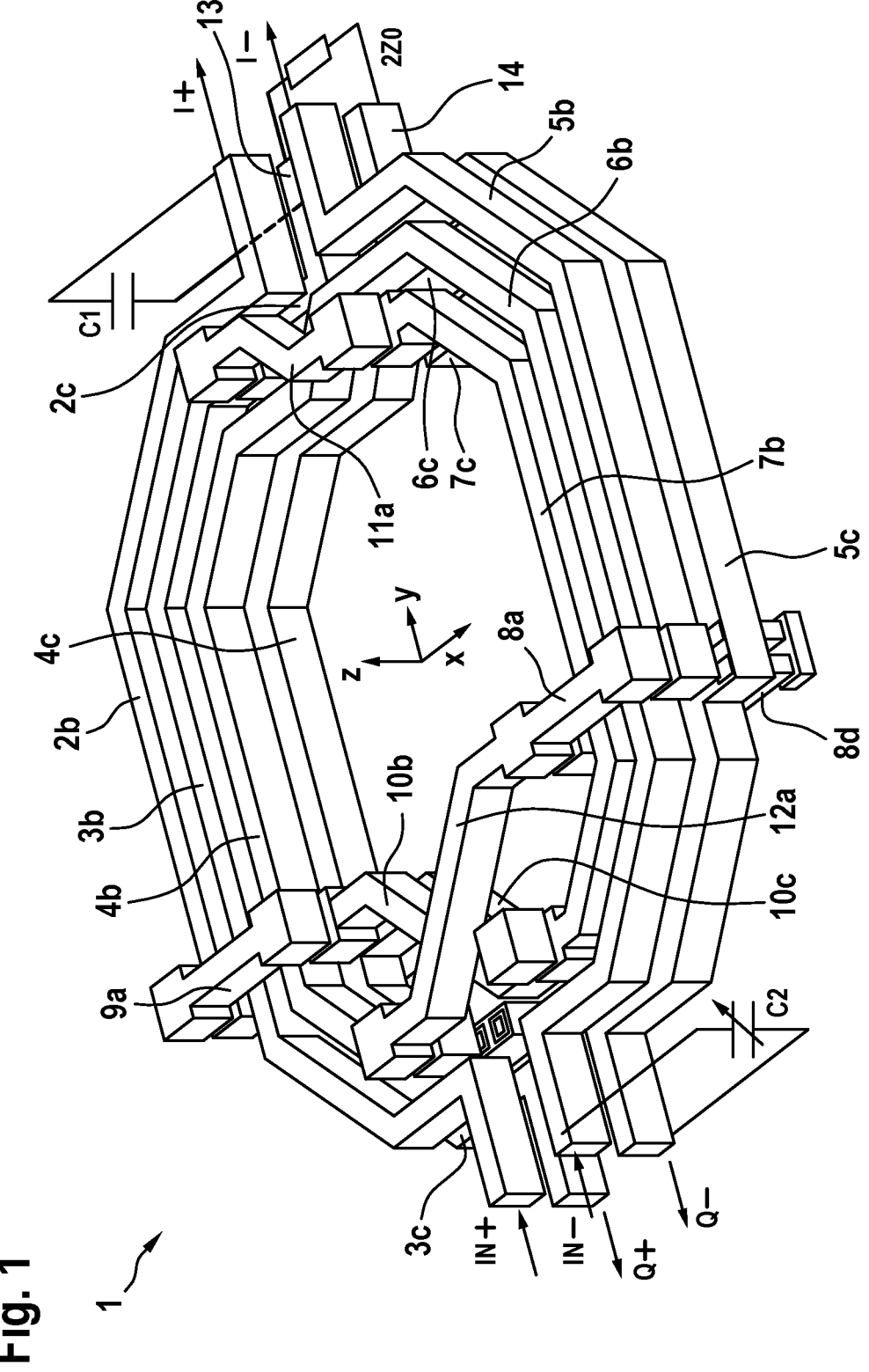
FIG. 1 shows a schematic oblique view of a device for generating IQ signals according to one example embodiment of the present invention.

FIG. 1 shows a schematic oblique view of a device 1 for generating IQ signals. The device 1 is an IQ generator (quadrature hybrid coupler) which receives a differential input signal and provides two differential output signals shifted by 90° if possible.

Figure 2:
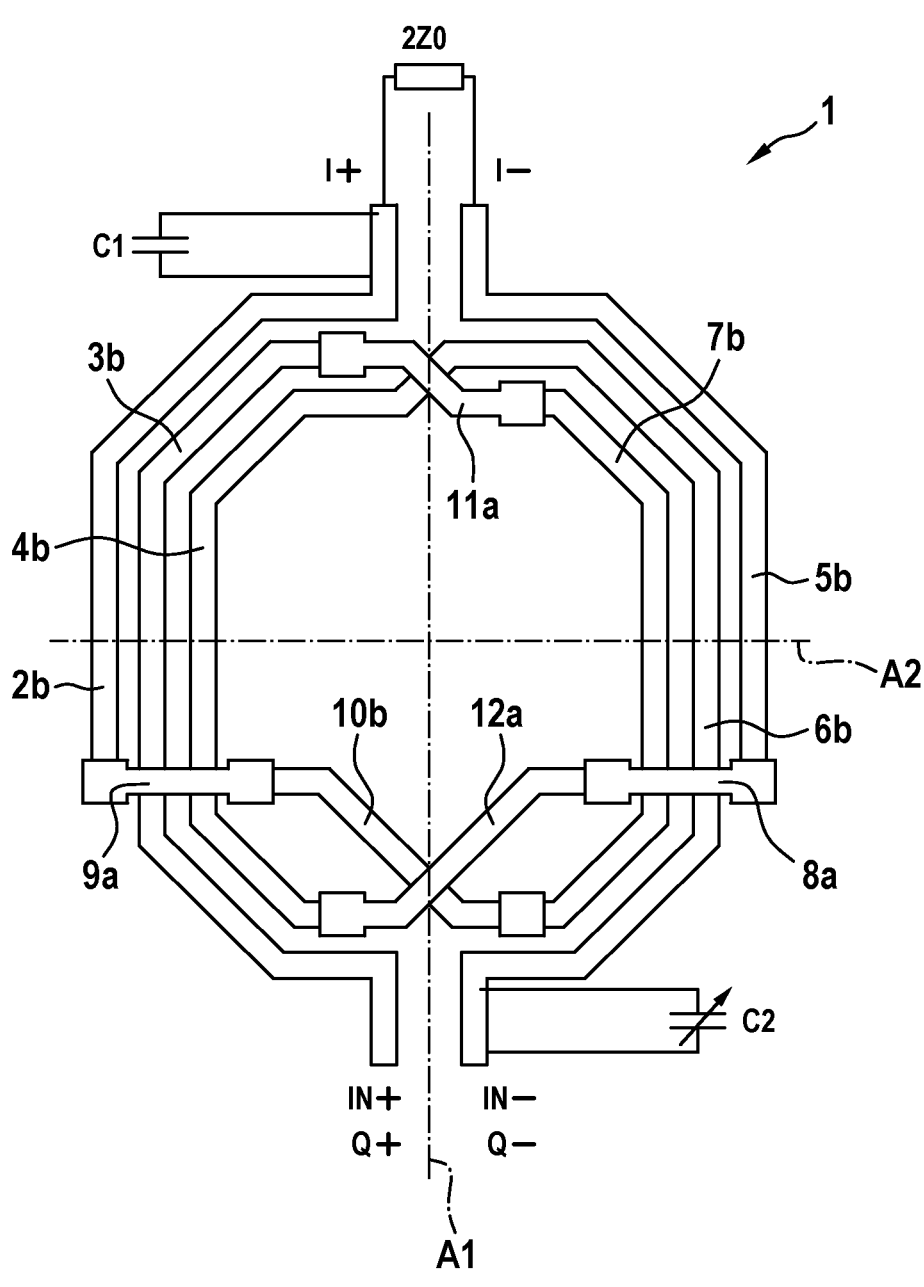
FIG. 2 shows a schematic top view of the device shown in FIG. 1 for generating IQ signals.

FIG. 2 shows a schematic top view of the device 1 shown in FIG. 1 for generating IQ signals.

The device 1 comprises a differential input port IN+, IN−, a differential transmitted port (through port) I+, I−, which outputs a differential I output signal as the first output port, and a differential coupled port Q+, Q−, which outputs a differential Q output signal as the second output port. The differential I output signal is shifted by 90° relative to the differential Q output signal if possible.

The device 1 furthermore comprises a differential isolated port 13, 14, wherein the terminals of the differential isolated port 13, 14 are electrically connected via a resistor 2·Z0=2·50Ω in order to avoid signal reflections and to achieve better impedance matching and isolation.

An IN+ terminal of the input port is electrically connected to an I+ terminal of the differential transmitted port via first to sixth line sections 3b, 11a, 7b, 10b, 9a, 2b of a first electrical connecting line, wherein the first electrical connecting line has one and a half windings.

An IN− terminal of the input port is electrically connected to an I− terminal of the differential transmitted port via first to fourth line sections 6b, 4b, 12a, 5b of a second electrical connecting line, wherein the second electrical connecting line has one and a half windings.

A first terminal 13 of the differential isolated port 13, 14 is electrically connected to a Q+ terminal of the differential coupled port via a plurality of line sections 2c, 10c, 7c, 3c of a third electrical connecting line, wherein the third electrical connecting line has one and a half windings.

A second terminal 14 of the differential isolated port 13, 14 is electrically connected to a Q− terminal of the differential coupled port via a plurality of line sections 5c, 8d, 4c, 6c of a fourth electrical connecting line, wherein the third electrical connecting line has one and a half windings.

According to further embodiments, the first to fourth electrical connecting lines have at least one additional winding, e.g., two and a half or three and a half windings in each case.

The I+ terminal of the differential transmitted port is electrically coupled to the first terminal 13 of the differential isolated port 13, 14 via a first capacitor C1. The IN− terminal of the input port is electrically coupled to the Q− terminal of the differential via a second capacitor C2.

As can be seen in FIG. 1, the first and second connecting lines mainly run in a first plane, wherein only some line sections 8a, 12a, 9a, 11a run at crossing points in a superjacent plane. Analogously, the third and fourth connecting lines mainly run in a second plane, which is below the first plane, while only some line sections (only one line section 8d is visible, the remaining ones run analogously to the first and second connecting lines) run at crossing points in a subjacent plane.

Overall, the first and second connecting lines run exactly the same as the third and fourth connecting lines in a top view, but in different planes of the substrate.

The device 1 is symmetrical with respect to a first axis A1 in a substrate plane in a top view. For each line section of the first and second connecting lines, there is a symmetrical line section with respect to the first axis A1, wherein possible differences due to the position in different planes are not taken into account. Analogously, there is a symmetrical line section with respect to the first axis A1 for each line section of the third and fourth connecting lines.

However, the device is asymmetrical with respect to a second axis A2, which is orthogonal to the first axis A1 and also runs in the substrate plane. Thus, there are line sections 10b, 12a of the first and second connecting lines, so that line sections 11a opposite one another with respect to the second axis A2 differ in their position (position or course of the line section).

Figure 3:
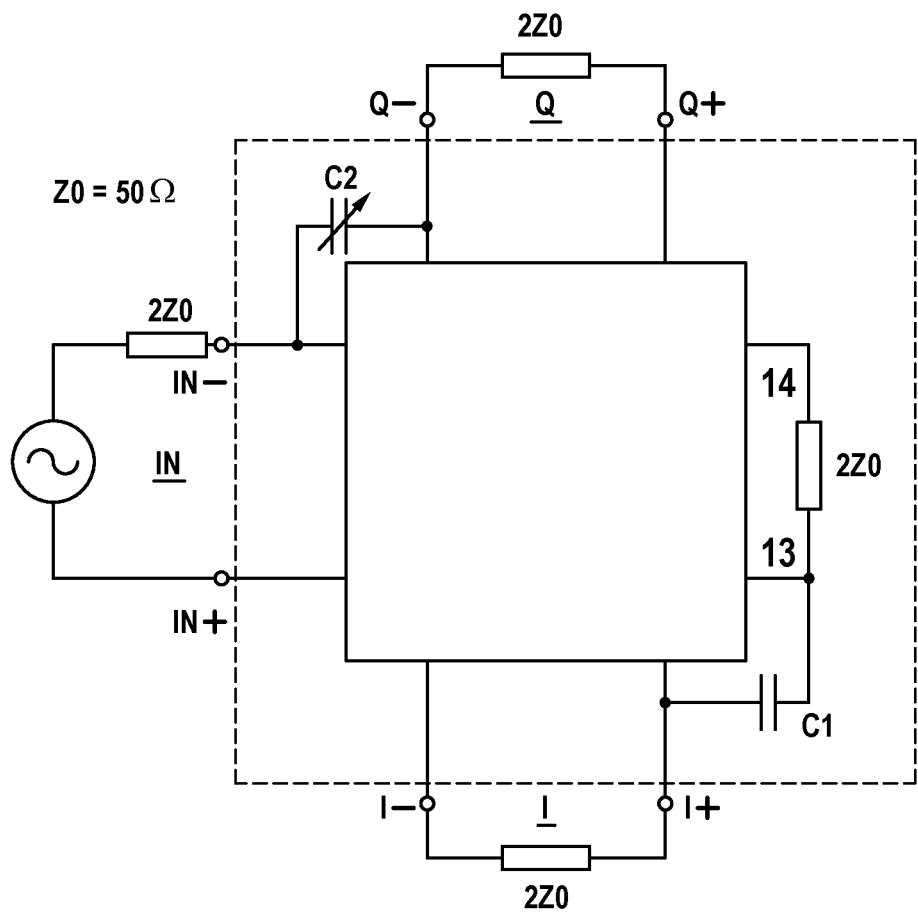
FIG. 3 shows a schematic block diagram of the device shown in FIG. 1 for generating IQ signals.

FIG. 3 shows a schematic block diagram of the device 1 shown in FIG. 1 for generating IQ signals. All terminals are matched to the same differential impedance 2·Z0, with Z0=50 Ohm, for example. The capacitance of the second capacitor C2 can also be set.

Figure 4:
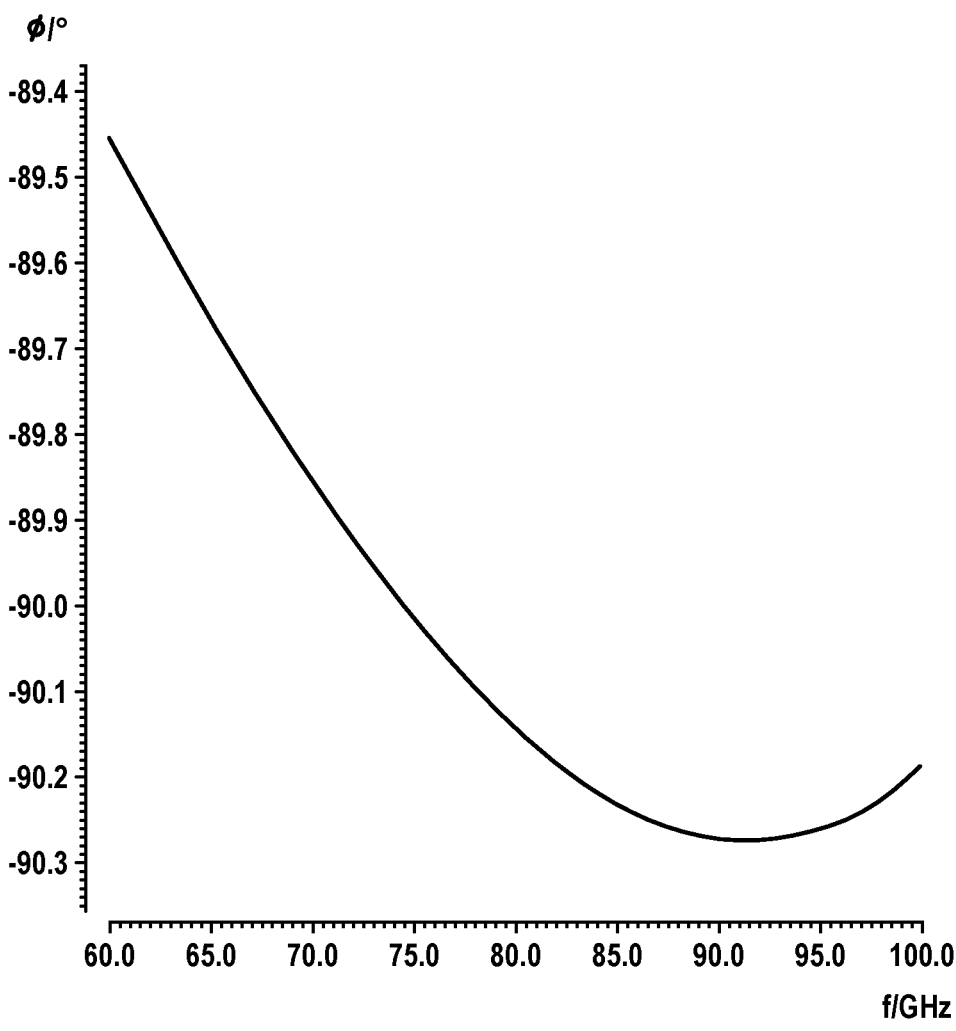
FIG. 4 shows an exemplary course of the IQ phase as a function of the frequency.

FIG. 4 shows an exemplary course of the IQ phase (phase difference between I output signal and Q output signal) as a function of the frequency f. The IQ phase is relatively close to the optimum value of 90° over a wide frequency range.

Figure 5:
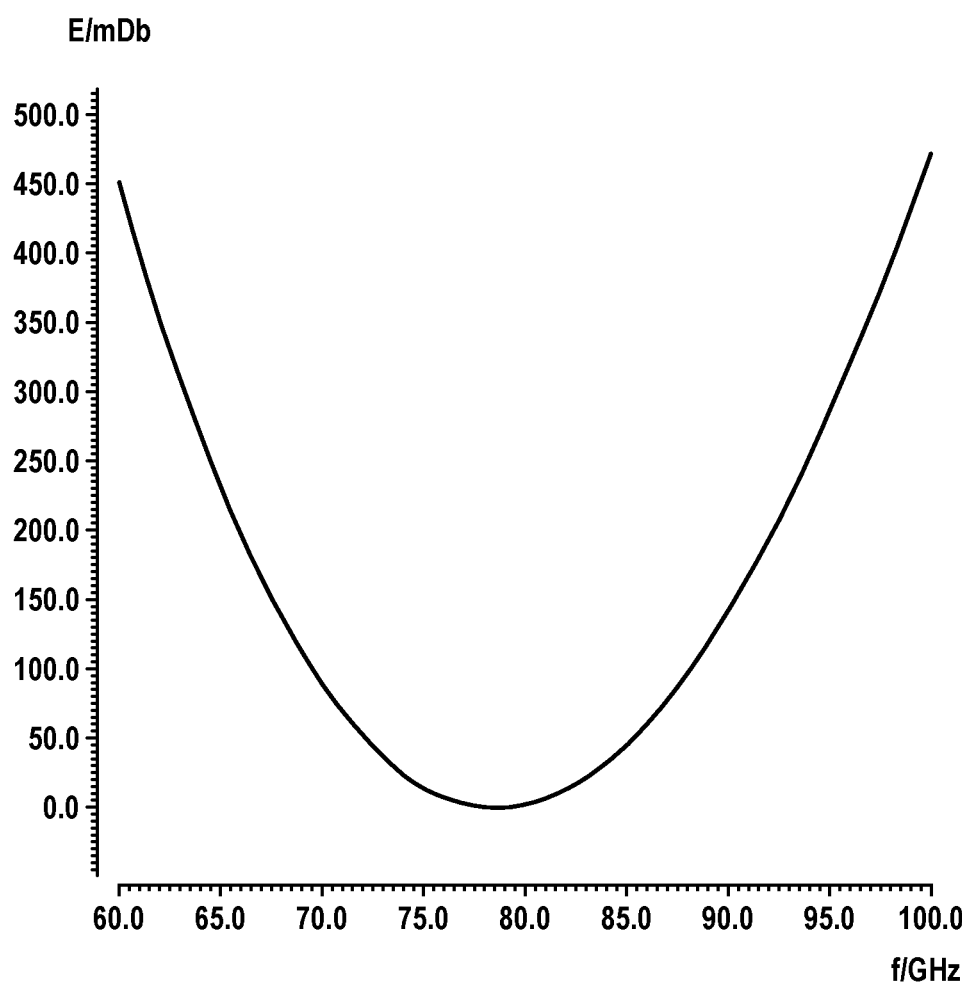
FIG. 5 shows an exemplary course of the IQ amplitude error as a function of the frequency.

FIG. 5 shows an exemplary course of the IQ amplitude error E as a function of the frequency f. The error is small for a wide frequency range.

Figure 6:
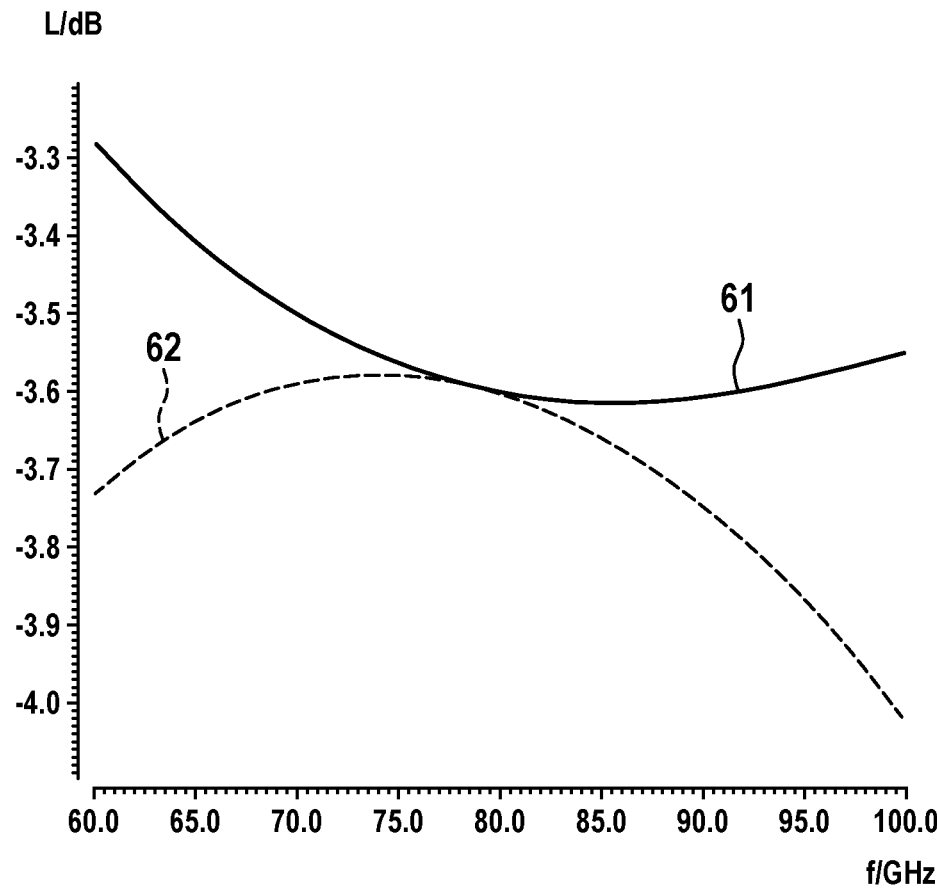
FIG. 6 shows an exemplary course of the power loss as a function of the frequency.

FIG. 6 shows an exemplary course of the power loss as a function of the frequency f. The loss of the I output signal 61 is equal to the loss of the Q output signal 62 for a frequency of 80 GHz. However, both losses are relatively small for a larger frequency range.

Figure 7:
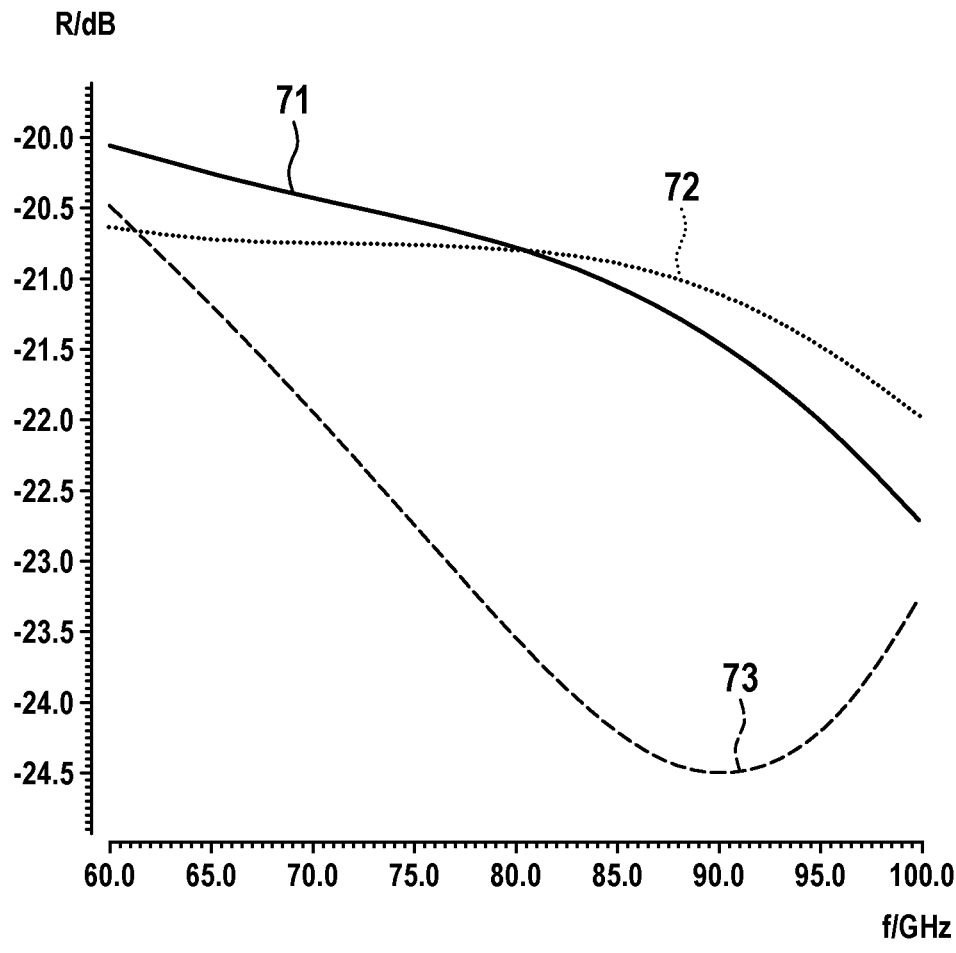
FIG. 7 shows an exemplary course of the reflection behavior as a function of the frequency.

FIG. 7 shows an exemplary course of the reflection behavior R for the input signal 71, the I output signal 73 and the Q output signal 72 as a function of the frequency.

Figure 8:
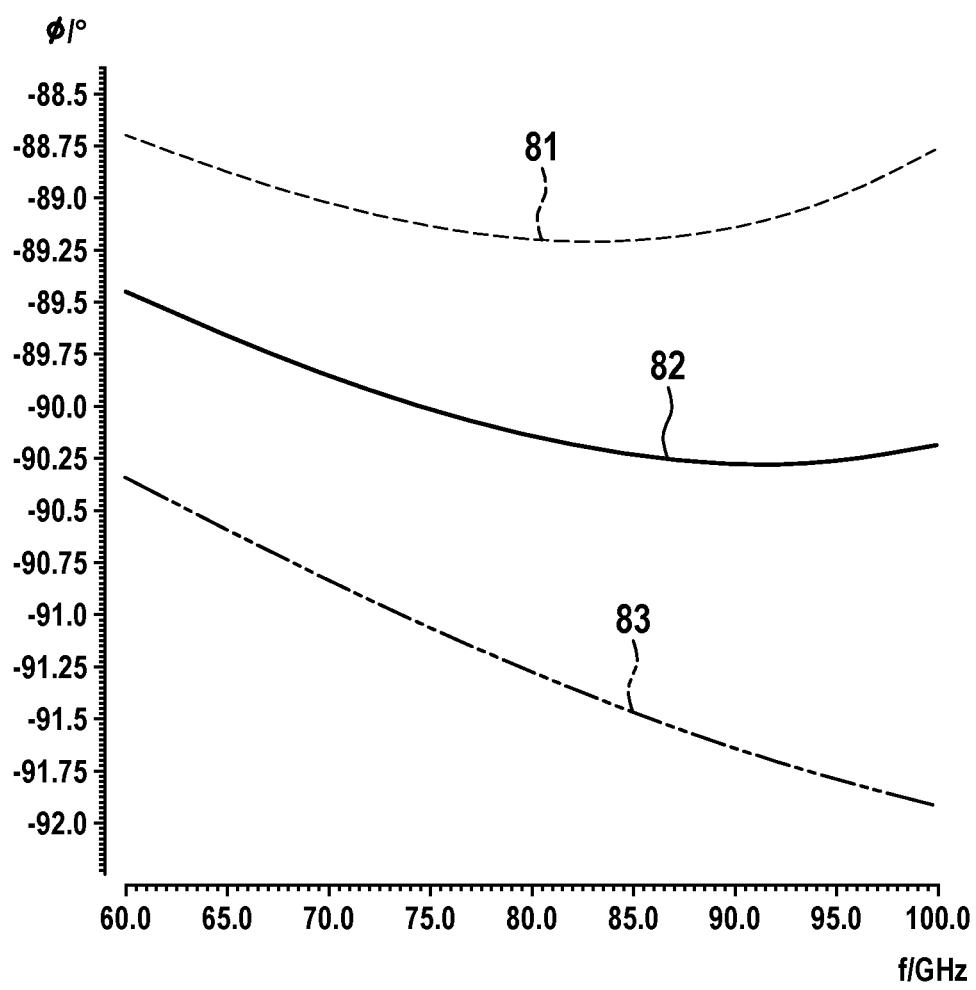
FIG. 8 shows an exemplary course of the IQ phase as a function of the frequency.

FIG. 8 shows an exemplary course of the IQ phase φ as a function of the frequency, wherein the capacitance of the second capacitor C2 is varied. Shown are the course 82 for a predetermined value of the capacitance, a course 81 for a deviation of the capacitance by 20% from the predetermined value, and a course 83 for a deviation of the capacitance by −20% from the predetermined value.

Figure 9:
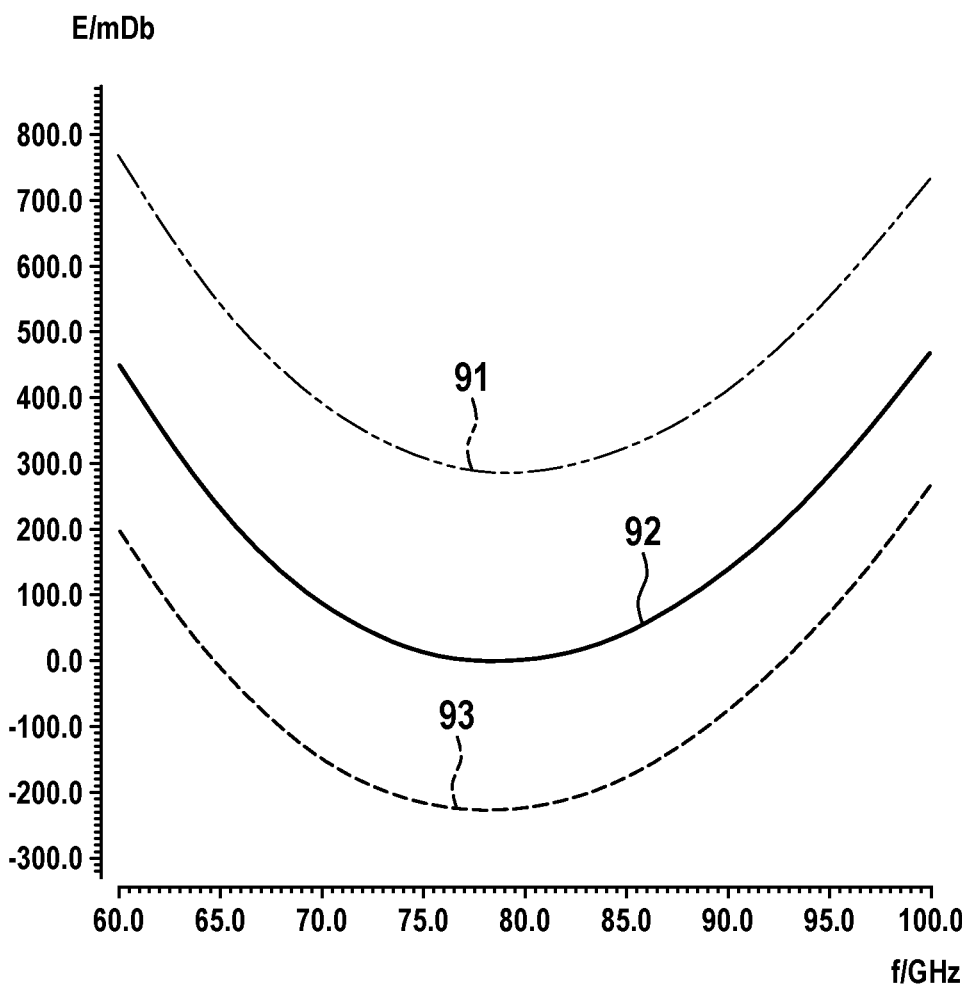
FIG. 9 shows an exemplary course of the IQ amplitude error as a function of the frequency.

FIG. 9 shows an exemplary course of the IQ amplitude error E as a function of the frequency f, wherein the capacitance of the second capacitor C2 is varied. Shown are the course 92 for a predetermined value of the capacitance, a course 93 for a deviation of the capacitance by 20% from the predetermined value, and a course 91 for a deviation of the capacitance by −20% from the predetermined value.

Figure 10:
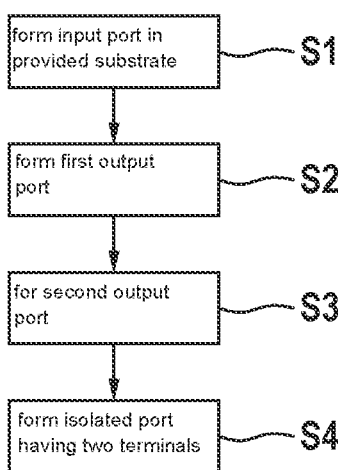
FIG. 10 shows an exemplary flow chart of a method for manufacturing a device for generating IQ signals according to one embodiment of the present invention.

FIG. 10 shows an exemplary flow chart of a method for manufacturing a device for generating IQ signals, in particular the device 1 described above.

An input port is formed in a provided substrate, S1. The input port can receive a differential input signal via a first and a second terminal of the input port.

A first output port is formed, S2. The first output port is designed to output a differential I output signal via a first and a second terminal of the first output port, wherein the first terminal of the input port is electrically connected to the first terminal of the first output port via a first connecting line, and wherein the second terminal of the input port is electrically connected to the second terminal of the first output port via a second connecting line.

A second output port is formed, S3. The second output port is designed to output a differential Q output signal via a first and a second terminal of the second output port.

An isolated port having two terminals is formed, S4, wherein the first terminal of the second output port is electrically connected to the first terminal of the isolated port via a third connecting line, and wherein the second terminal of the second output port is electrically connected to the second terminal of the isolated port via a fourth connecting line. The first and second connecting lines are formed in at least a first plane of a substrate of the device. The third and fourth connecting lines are formed offset to the first and second connecting lines in at least a second plane of the substrate. In a top view, the first to fourth connecting lines are arranged symmetrically with respect to a first axis and asymmetrically with respect to a second axis, wherein the first axis and the second axis are orthogonal to one another in a substrate plane of the substrate.

While the method has been divided into a plurality of steps S1 to S4 for better understanding, it is understood that the method steps can also be carried out in parallel order or in a different order.

The invention claimed is:

1. A device for generating IQ signals, comprising:
   an input port configured to receive a differential input signal via a first and a second terminal of the input port;
   a first output port configured to output a differential I output signal via a first and a second terminal of the first output port, wherein the first terminal of the input port is electrically connected to the first terminal of the first output port via a first connecting line, and wherein the second terminal of the input port is electrically connected to the second terminal of the first output port via a second connecting line;

a second output port configured to output a differential Q output signal via a first and a second terminal of the second output port;

an isolated port having two terminals, wherein the first terminal of the second output port is electrically connected to a first terminal of the isolated port via a third connecting line, and the second terminal of the second output port is electrically connected to a second terminal of the isolated port via a fourth connecting line;

wherein the first and second connecting lines are formed in at least a first plane of a substrate of the device, and wherein the third and fourth connecting lines are formed offset to the first and second connecting lines in at least a second plane of the substrate; and wherein the first, second, third, and fourth connecting lines are arranged symmetrically with respect to a first axis and asymmetrically with respect to a second axis in a top view, wherein the first axis and the second axis are orthogonal to one another in a substrate plane of the substrate.

2. The device according to claim 1, further comprising:

at most three passive circuit elements, including an electrical resistor connected between the first terminal and the second terminal of the isolated port.

3. The device according to claim 2, wherein: (i) the at most three passive circuit elements include a first capacitor that is connected between the first terminal of the first output port and the first terminal of the isolated port, and/or (ii) the at most three passive circuit elements include a second capacitor that is connected between the second terminal of the input port and the second terminal of the second output port.

4. The device according to claim 3, wherein a capacitance of the first capacitor and/or a capacitance of the second capacitor is capable of being adjusted.

5. The device according to claim 4, wherein the first capacitor and/or the second capacitor is: (i) a controllable varactor or (ii) a capacitor that can be switched on and off digitally.

6. The device according to claim 1, wherein each of the first, second, third, and fourth connecting lines has at least one and a half windings.

7. A method for manufacturing a device for generating IQ signals, comprising the following steps:

forming an input port that is configured to receive a differential input signal via a first and a second terminal of the input port;

forming a first output port that is configured to output a differential I output signal via a first and a second terminal of the first output port, wherein the first terminal of the input port is electrically connected to the first terminal of the first output port via a first connecting line, and the second terminal of the input port is electrically connected to the second terminal of the first output port via a second connecting line;

forming a second output port that is configured to output a differential Q output signal via a first and a second terminal of the second output port; and forming an isolated port having two terminals, wherein the first terminal of the second output port is electrically connected to a first terminal of the isolated port via a third connecting line, and the second terminal of the second output port is electrically connected to a second terminal of the isolated port via a fourth connecting line;

wherein the first and second connecting lines are formed in at least a first plane of a substrate of the device, and the third and fourth connecting lines are formed offset to the first and second connecting lines in at least a second plane of the substrate; and wherein the first, second, third, and fourth connecting lines are arranged symmetrically with respect to a first axis and asymmetrically with respect to a second axis in a top view, wherein the first axis and the second axis are orthogonal to one another in a substrate plane of the substrate.

8. The method according to claim 7, wherein at most three passive circuit elements are formed, including an electrical resistor that is connected between the first terminal and the second terminal of the isolated port.

9. The method according to claim 8, wherein: (i) the at most three passive circuit elements include a first capacitor that is connected between the first terminal of the first output port and the first terminal of the isolated port, and/or (ii) the at most three passive circuit elements include a second capacitor that is connected between the second terminal of the input port and the second terminal of the second output port.

10. The method according to claim 9, wherein a capacitance of the first capacitor and/or a capacitance of the second capacitor is capable of being adjusted.

* * * * *